United States Patent
Shin et al.

(10) Patent No.: US 12,224,774 B2
(45) Date of Patent: Feb. 11, 2025

(54) RUNTIME RECONFIGURABLE COMPRESSION FORMAT CONVERSION

(71) Applicant: Samsung Electronics Co., Ltd., Suwon-si (KR)

(72) Inventors: Jong Hoon Shin, San Jose, CA (US); Ardavan Pedram, Santa Clara, CA (US); Joseph Hassoun, Los Gatos, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 212 days.

(21) Appl. No.: 18/096,551

(22) Filed: Jan. 12, 2023

(65) Prior Publication Data
US 2024/0162916 A1 May 16, 2024

Related U.S. Application Data

(60) Provisional application No. 63/426,027, filed on Nov. 16, 2022.

(51) Int. Cl.
*H03M 7/30* (2006.01)
*G06F 8/41* (2018.01)
(Continued)

(52) U.S. Cl.
CPC ........ *H03M 7/3059* (2013.01); *G06F 8/4432* (2013.01); *G06F 8/4434* (2013.01);
(Continued)

(58) Field of Classification Search
CPC ............. H03M 7/3059; H03M 7/6011; H03M 7/6094; H03M 7/3079; H03M 7/6064;
(Continued)

(56) References Cited

U.S. PATENT DOCUMENTS 10,186,011 B2   1/2019   Nurvitadhi et al.
10,346,944 B2   7/2019   Nurvitadhi et al.
(Continued)

OTHER PUBLICATIONS

Cavigelli, Lukas et al., "EBPC: Extended Bit-Plane Compression for Deep Neural Network Inference and Training Accelerators" IEEE Journal on Emerging and Selected Topics in Circuits and Systems, vol. 9, No. 4, 2019, 13 pages.
(Continued)

*Primary Examiner* — Khai M Nguyen
(74) *Attorney, Agent, or Firm* — Renaissance IP Law Group LLP

(57) ABSTRACT

A runtime data-format optimizer for a processing element includes a sparsity-detector and a compression-converter. The sparsity-detector selects a first compression-conversion format during a runtime of the processing element based on a performance model that is based on a first sparsity pattern of first data stored in a first memory that is exterior to the processing element and a second sparsity pattern of second data that is to be stored in a second memory within the processing element. The second sparsity pattern is based on a runtime configuration of the processing element. The first data is stored in the first memory using a first compression format and the second data is to be stored in the second memory using a second compression format. The compression-conversion circuit converts the first compression format of the first data to be the second compression format of the second data based on the first compression-conversion format.

17 Claims, 2 Drawing Sheets

(51) Int. Cl.
*G06N 3/0495* (2023.01)
*G06N 3/063* (2023.01)
*H03M 7/46* (2006.01)

(52) U.S. Cl.
CPC ........ *G06N 3/0495* (2023.01); *H03M 7/3079* (2013.01); *H03M 7/6011* (2013.01); *H03M 7/6064* (2013.01); *H03M 7/6094* (2013.01); *G06N 3/063* (2013.01); *H03M 7/46* (2013.01); *H03M 7/6017* (2013.01)

(58) Field of Classification Search
CPC ...... H03M 7/46; H03M 7/6017; G06N 3/063; G06N 3/0495; G06F 8/4432; G06F 8/4434
USPC ...................................................... 341/50–51
See application file for complete search history.

(56) References Cited

U.S. PATENT DOCUMENTS

| | | | |
|---|---|---|---|
| 10,546,393 | B2 | 1/2020 | Ray et al. |
| 10,951,897 | B2 | 3/2021 | Taubman et al. |
| 11,489,541 | B2 * | 11/2022 | Latorre ................... G06N 3/08 |
| 11,757,469 | B2 * | 9/2023 | Kulkarni ............... H03M 7/702 341/50 |
| 2018/0189675 | A1 | 7/2018 | Nurvitadhi et al. |
| 2020/0364508 | A1 | 11/2020 | Gurel et al. |
| 2021/0103550 | A1 | 4/2021 | Appu et al. |
| 2021/0146531 | A1 | 5/2021 | Tremblay et al. |
| 2022/0129521 | A1 | 4/2022 | Surti et al. |
| 2022/0318557 | A1 | 10/2022 | Mohseni et al. |

OTHER PUBLICATIONS

Dong, Shi et al., "Spartan: a Sparsity-Adaptive Framework to Accelerate Deep Neural Network Training on GPUs" IEEE Transactions on Parallel and Distributed Systems, vol. 32, No. 10, 2021, 17 pages.

Ko, Yousun et al., "Lane Compression: a Lightweight Lossless Compression Method for Machine Learning on Embedded Systems" ACM Transactions on Embedded Computing Systems, vol. 20, No. 2, 2021, 26 pages.

Kwon, Jisu et al., "Sparse Convolutional Neural Network Acceleration with Lossless Input Feature Map Compression for Resource-Constrained Systems", IET Computers & Digital Techniques, vol. 16, No. 1, 2021, pp. 29-43.

Parashar, Angshuman et al., "Timeloop: a Systematic Approach to DNN Accelerator Evaluation" 2019 IEEE International Symposium on Performance Analysis of Systems and Software (ISPASS), 2019, 12 pages.

Qin, Eric et al., "Extending Sparse Tensor Accelerators to Support Multiple Compression Formats" 2021 IEEE International Parallel and Distributed Processing Symposium (IPDPS), 2021, 11 pages.

Qin, Eric et al., "MINT: Microarchitecture for Efficient and Interchangeable CompressioN Formats on Tensor Algebra" MICRO 2020, Sandia National Lab.(SNL-NM), No. SAND2020-4760C, 2020, 13 pages.

Yazdanbakhsh, Amir et al., "Sparse Attention Acceleration with Synergistic In-Memory Pruning and On-Chip Recomputation", 2022 55th IEEE/ACM International Symposium on Microarchitecture (MICRO), 2022, 19 pages.

\* cited by examiner

RUNTIME RECONFIGURABLE COMPRESSION FORMAT CONVERSION

CROSS-REFERENCE TO RELATED APPLICATION

This application claims the priority benefit under 35 U.S.C. § 119(e) of U.S. Provisional Application No. 63/426,027, filed on Nov. 16, 2022, the disclosure of which is incorporated herein by reference in its entirety.

TECHNICAL FIELD

The subject matter disclosed herein relates to deep neural networks. More particularly, the subject matter disclosed herein relates to a runtime compression converter that optimizes compression-format conversion of off-chip and on-chip data of an accelerator executing a deep-learning neural network.

BACKGROUND

Deep neural networks (DNNs) may be accelerated by NPUs (Neural Processing Units). A performance bottleneck may occur due to a limited memory bandwidth. To mitigate such a performance bottleneck, it may be important to use optimal compression formats for outside and inside the NPU. A reconfigurable compression format conversion has been previously disclosed, however, in that case a compression format conversion that has been selected to be used is made before deployment of the DNN. Because future workloads are unpredictable, the fact that the compression conversion format is fixed prior to runtime and that a decision regarding a runtime compression conversion format is unavailable may result in less than optimal compression formats being used.

The compression ratio and the cost associated with compression/decompression varies with sparsity-pattern. The sparsity-pattern of a deep-learning application differs from time to time, and Deep Learning (DL) workloads executed by a NPU may be difficult to predict prior to DNN deployment time.

A conventional approach has been to make a decision of a data compression format for a DL application at design time prior to deployment. The sparsity pattern of data for a DL application may, however, differ over time, and a compression ratio and a cost associated with compression/decompression varies with sparsity-pattern of DL data. So using a single fixed compression format may not be efficient and a runtime decision to determine and use an optimal data compression format would be beneficial.

SUMMARY

An example embodiment provides a data-format optimizer for a processing element that may include a sparsity-detection circuit and a compression-conversion circuit. The sparsity-detection circuit may be configured to select a first compression-conversion format during a runtime of the processing element based, at least in part, on a first performance model that is based on a first sparsity pattern of first data stored in a first memory that is exterior to the processing element and a second sparsity pattern of second data that is to be stored in a second memory within the processing element in which the second sparsity pattern may be based on a runtime configuration of the processing element, and in which the first data may be stored in the first memory using a first compression format and the second data is to be stored in the second memory using a second compression format. The compression-conversion circuit may be configured to convert the first compression format of the first data to be the second compression format of the second data based on the first compression-conversion format. In one embodiment, the first performance model may further include a latency associated with converting the first data to the second data. In another embodiment, the first performance model may further include an energy consumption associated with converting the first data to the second data. In still another embodiment, the first performance model may further include an energy consumption associated with converting the first data to the second data. In yet another embodiment, the sparsity-detection circuit may be further configured to select a second compression-conversion format during runtime of the processing element based, at least in part, on a second performance model that is based on a third sparsity pattern of output data stored in a third memory within the processing element, and the compression-conversion circuit may be configured to convert the output data to a third compression format that is based on the second compression-conversion format for storage in the first memory. In one embodiment, the sparsity-detection circuit may be further configured to generate two or more performance models from which the first performance model is selected. In another embodiment, the sparsity-detection circuit may be configured to sample the first sparsity pattern of first data to generate the two or more performance models. In still another embodiment, the sparsity-detection circuit may be configured to generate the two or more performance models further based on sparsity operational modes of the processing element. In yet another embodiment, at least one of the first compression format and the second compression format may include a Run Length Encoding, a Zero Value Compression, a Compressed Sparse Column encoding, or a Compressed Sparse Row encoding.

An example embodiment provides a data-format optimizer for a processing element that may include a sparsity-detection circuit and a compression-conversion circuit. The sparsity-detection circuit may be configured to generate, during a runtime of the processing element, at least one or more performance models that are based on a first sparsity pattern of first data stored in a first memory and a second sparsity pattern of second data that is to be stored in a second memory in which the first memory may be exterior to the processing element and the second memory may be within the processing element, and to determine a first compression-conversion format based, at least in part, a selection of the one or more performance models. The compression-conversion circuit may be configured to apply the first compression-conversion format to the first data to become the second data. In one embodiment, the sparsity-detection circuit may be configured to sample the first sparsity pattern of the first data to generate the one or more performance models. In another embodiment, the sparsity-detection circuit may be is configured to generate the one or more performance models further based on sparsity operational modes of the processing element. In still another embodiment, each performance model may include a latency associated with converting the first data to the second data. In yet another embodiment, at least one performance model may further include an energy consumption associated with converting the first data to the second data. In one embodiment, at least one performance model may further include an energy consumption associated with converting the first data to the second data. In another embodiment, the sparsity-detection circuit may be further configured to select a second compression-conversion format during the runtime of the processing element based, at least in part, on a second performance model that is based on a third sparsity pattern of output data stored in a third memory within the processing element, and the compression-conversion circuit may be configured to convert the output data to a third compression format that is based on the second compression-conversion format for storage in the first memory. In still another embodiment, the first compression format may include a Run Length Encoding, a Zero Value Compression, a Compressed Sparse Column encoding, or a Compressed Sparse Row encoding.

BRIEF DESCRIPTION OF THE DRAWING

In the following section, the aspects of the subject matter disclosed herein will be described with reference to exemplary embodiments illustrated in the figure, in which.

DETAILED DESCRIPTION

Figure 1:
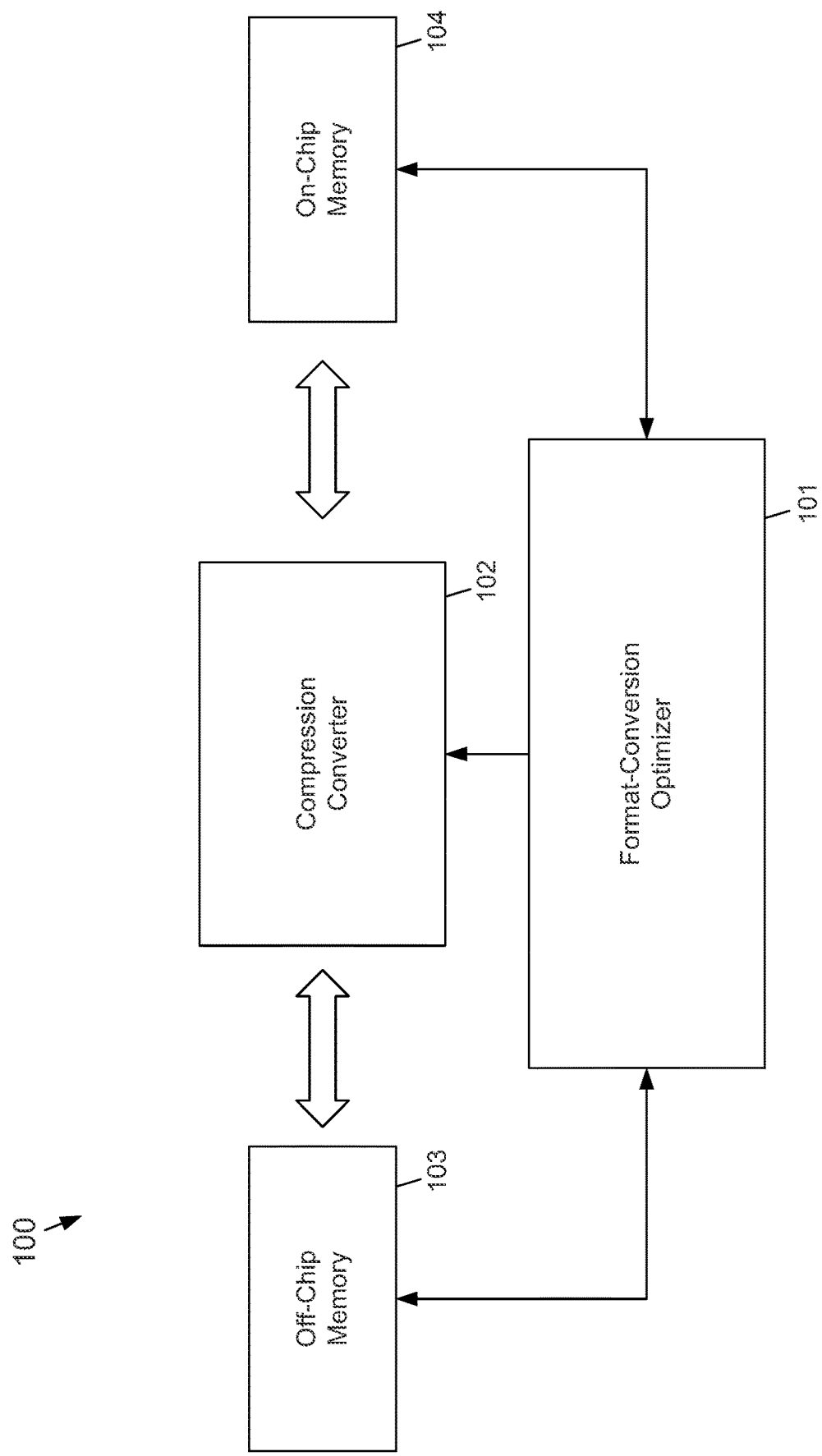
FIG. 1 is a functional block diagram of an example embodiment of a runtime reconfigurable compression format converter circuit according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

The subject matter disclosed herein provides a runtime (training and/or inference) compression conversion format optimizer for DL accelerators, or processing elements (PEs). In one embodiment, a format-conversion optimizer may be located at an interface between a memory (i.e., DRAM) and an on-chip NPU memory. The format-conversion optimizer may sample the sparse data during runtime and based on a detected sparsity-pattern, or detected sparsity characteristics of the data, the sparsity-pattern detector may determine an optimal data compression format for both the off-chip and on-chip data based on latency, conversion cost, and system-level energy consumption estimates. As used herein, the term "conversion cost" includes a power/area/latency due to a compression-format conversion process. So, the sparsity-pattern detector may determine optimal data compression formats for both the off-chip and on-chip data based on an increase in latency and system-level energy consumption due to the process of conversion from a memory-compression format to an accelerator-compression format. For example, a sparsity-pattern detector module (or circuit) of the format-conversion optimizer module may sample data from workloads during runtime, and a performance modeler module of the format-conversion optimizer module may estimate compression rates and energy consumption for different compression formats using an analytic performance model, and determine an optimal compression format for both off-chip and on-chip data. A compression conversion module may apply the runtime compression format decision determined by the format-conversion optimizer module.

In one embodiment, a runtime reconfigurable format-conversion optimizer detects a sparse data pattern for any DL workload (including sparsity patterns that were not expected to likely be encountered at design time) and determines efficient compression formats and conversions for the DL data.

The subject matter disclosed herein provides a runtime (training and/or inference) data compression format optimization for DL accelerators by locating a format-conversion optimizer at an interface of off-chip DRAM and on-chip memory that determines optimal data compression formats for both off-chip and on-chip accelerator data by sampling sparse DL data, and based on an estimated latency, conversion cost, and system-level energy consumption.

FIG. 1 is a functional block diagram of an example embodiment of a runtime reconfigurable compression format converter circuit 100 according to the subject matter disclosed herein. The format converter circuit 100 may include a format-conversion optimizer circuit 101, and a compression converter circuit 102. In one embodiment, one or both of the sparsity-pattern detector and performance modeler circuit 101 and the compression converter circuit 102 may be embodied as a module or a circuit.

In one embodiment, the format-conversion optimizer circuit 101 may be located at an interface between the off-chip memory 103 and the on-chip memory 104. The format-conversion optimizer circuit 101 may be configured as a counter that detects the non-zero value density by streaming a sampled portion of a tensor block. The sparsity-pattern detector aspect of the format-conversion optimizer circuit 101 may also have additional functionality, such as checking temporal and spatial locality of non-zero value occurrence, which are useful information to optimize the compression formats.

In one embodiment, the format-conversion optimizer circuit 101 may be configured to sample sparse data from an off-chip memory 103 and from an on-chip NPU memory 104 during runtime (training or inference). In one embodiment, the format-conversion optimizer circuit 101 determines sparsity patterns of the off-chip data by decompressing the off-chip data before sampling the data to determine sparsity patterns based on a granularity and timing of the data. The granularity of sparsity pattern may be determined by adjusting a sample size and a sampling frequency. For this adjustment, the format-conversion optimizer circuit 101 may use a simple algorithm (e.g., increasing the sample size if the data has high sparsity and/or increase the sampling frequency if the neighboring samples show different sparsity-patterns) or a complex algorithm (e.g., reinforcement learning). Although the off-chip compression format include an associated metadata that may be referred to for the decompression process, sampling of the off-chip data is not determined by the associated metadata, but is determined by the format-conversion optimizer circuit 101.

A performance model may be generated based on an estimated compression ratio for different compression formats for sparse data in the off-accelerator chip memory 103 and the on-accelerator chip memory 104. The various on-chip data compression formats and sparsity formats, such as structured sparsity, random sparsity and block-wise sparsity, are included as inputs to the performance models. The format-conversion optimizer circuit 101 may include a microcontroller having a small size memory to run a performance model that may be provide an analytical modeling of dataflow of a NPU. More specifically, the dataflow in the NPU, which may include spatial parallelism, order-of-execution, on/off-chip-memory scheduling, and multi-core scheduling, may be described by a for-loop representation similar to a TimeLoop-type modeling and/or other dataflow representation modeling. The performance model analyzes the dataflow representation and calculates an approximate latency, utilization, a required memory bandwidth, a required capacity, spatial and temporal data reuse, and a power efficiency for each compression-format conversion.

The format-conversion optimizer circuit 101 selects compression formats for both memories 103 and 104 that are estimated to provide the best performance or at least an improved performance and that have a relatively low conversion cost. An indication of the selected formats is output to the compression converter circuit 102.

The compression converter circuit 102 may be configured to convert memory-compression formats to accelerator compression formats. Additionally, the compression converter circuit 102 may provide functionalities such as prefix-sum, a memory controller, parallel divide/modulus calculators and comparators, and other format specific modules. In one embodiment, the compression converter circuit 102 may be embodied as a controller or a microcontroller having an associated memory for storing instructions providing functionality and for performing conversion computations.

The compression converter circuit 102 may be configured to be responsive to compression conversion format selections made by the format-conversion optimizer circuit 101 in order to convert between various compression formats. In one embodiment, the compression converter circuit 102 may use compression formats such as, but not limited to, Run Length Encoding (RLE), Zero Value Compression (ZVC), Compressed Sparse Column (CSC) encoding, Compressed Sparse Row (CSR) encoding.

Figure 2:
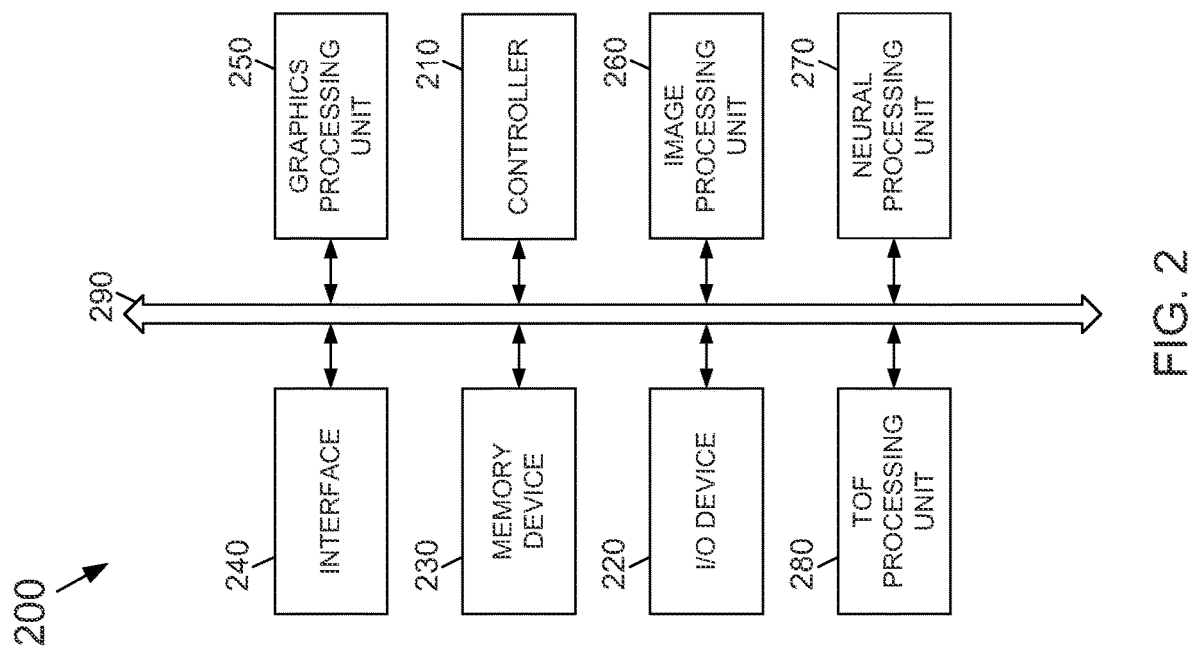
FIG. 2 depicts an electronic device 200 that may include a runtime reconfigurable compression format converter according to the subject matter disclosed herein.

FIG. 2 depicts an electronic device 200 that may include a runtime reconfigurable compression format converter according to the subject matter disclosed herein. Electronic device 200 and the various system components of electronic device 200 may be formed from one or modules. The electronic device 200 may include a controller (or CPU) 210, an input/output device 220 such as, but not limited to, a keypad, a keyboard, a display, a touch-screen display, a 2D image sensor, a 3D image sensor, a memory 230, an interface 240, a GPU 250, an imaging-processing unit 260, a neural processing unit 270, a TOF processing unit 280 that are coupled to each other through a bus 290. In one embodiment, the electronic device 200 may include a runtime reconfigurable compression format converter that converts data compression formats in connection with operation of the neural processing unit 270. In one embodiment, the 2D image sensor and/or the 3D image sensor may be part of the imaging processing unit 260. In another embodiment, the 3D image sensor may be part of the TOF processing unit 280. The controller 210 may include, for example, at least one microprocessor, at least one digital signal processor, at least one microcontroller, or the like. The memory 230 may be configured to store command codes that are to be used by the controller 210 and/or to store a user data.

The interface 240 may be configured to include a wireless interface that is configured to transmit data to or receive data from, for example, a wireless communication network using a RF signal. The wireless interface 240 may include, for example, an antenna. The electronic system 200 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), Fifth-Generation Wireless (5G), Sixth-Generation Wireless (6G), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A data-format optimizer for a processing element, comprising:
   a sparsity-detection circuit configured to select a first compression-conversion format during a runtime of the processing element based, at least in part, on a first performance model that is based on a first sparsity pattern of first data stored in a first memory that is exterior to the processing element and a second sparsity pattern of second data that is to be stored in a second memory within the processing element, the second sparsity pattern being based on a runtime configuration of the processing element, the first data being stored in the first memory using a first compression format and the second data to be stored in the second memory using a second compression format; and
   a compression-conversion circuit configured to convert the first compression format of the first data to be the second compression format of the second data based on the first compression-conversion format.

2. The data-format optimizer of claim 1, wherein the first performance model further includes a latency associated with converting the first data to the second data.

3. The data-format optimizer of claim 2, wherein the first performance model further includes an energy consumption associated with converting the first data to the second data.

4. The data-format optimizer of claim 1, wherein the first performance model further includes an energy consumption associated with converting the first data to the second data.

5. The data-format optimizer of claim 1, wherein the sparsity-detection circuit is further configured to select a second compression-conversion format during runtime of the processing element based, at least in part, on a second performance model that is based on a third sparsity pattern of output data stored in a third memory within the processing element; and
   wherein the compression-conversion circuit configured to convert the output data to a third compression format that is based on the second compression-conversion format for storage in the first memory.

6. The data-format optimizer of claim 1, wherein the sparsity-detection circuit is further configured to generate two or more performance models from which the first performance model is selected.

7. The data-format optimizer of claim 6, wherein the sparsity-detection circuit is configured to sample the first sparsity pattern of first data to generate the two or more performance models.

8. The data-format optimizer of claim 7, wherein the sparsity-detection circuit is configured to generate the two or more performance models further based on sparsity operational modes of the processing element.

9. The data-format optimizer of claim 1, wherein at least one of the first compression format and the second compression format comprises a Run Length Encoding (RLE), a Zero Value Compression (ZVC), a Compressed Sparse Column (CSC) encoding, or a Compressed Sparse Row (CSR) encoding.

10. A data-format optimizer for a processing element, comprising:
    a sparsity-detection circuit configured to generate, during a runtime of the processing element, at least one or more performance models that are based on a first sparsity pattern of first data stored in a first memory and a second sparsity pattern of second data that is to be stored in a second memory, the first memory being exterior to the processing element and the second memory being within the processing element, and to determine a first compression-conversion format based, at least in part, a selection of the one or more performance models; and
    a compression-conversion circuit configured to apply the first compression-conversion format to the first data to become the second data.

11. The data-format optimizer of claim 10, wherein the sparsity-detection circuit is configured to sample the first sparsity pattern of the first data to generate the one or more performance models.

12. The data-format optimizer of claim 11, wherein the sparsity-detection circuit is configured to generate the one or more performance models further based on sparsity operational modes of the processing element.

13. The data-format optimizer of claim 10, wherein each performance model includes a latency associated with converting the first data to the second data.

14. The data-format optimizer of claim 13, wherein at least one performance model further includes an energy consumption associated with converting the first data to the second data.

15. The data-format optimizer of claim 10, wherein at least one performance model further includes an energy consumption associated with converting the first data to the second data.

16. The data-format optimizer of claim 10, wherein the sparsity-detection circuit is further configured to select a second compression-conversion format during the runtime of the processing element based, at least in part, on a second performance model that is based on a third sparsity pattern of output data stored in a third memory within the processing element; and
    wherein the compression-conversion circuit configured to convert the output data to a third compression format that is based on the second compression-conversion format for storage in the first memory.

17. The data-format optimizer of claim 10, wherein the first compression format comprises a Run Length Encoding (RLE), a Zero Value Compression (ZVC), a Compressed Sparse Column (CSC) encoding, or a Compressed Sparse Row (CSR) encoding.

* * * * *